United States Patent
Zhu et al.

(10) Patent No.: US 7,916,060 B2
(45) Date of Patent: Mar. 29, 2011

(54) INTELLIGENT ELECTRONIC DEVICE HAVING CIRCUITRY FOR NOISE REDUCTION FOR ANALOG-TO-DIGITAL CONVERTERS

(75) Inventors: Hai Zhu, Glen Cove, NY (US); Joseph Spanier, Brooklyn, NY (US)

(73) Assignee: Electro Industries/Gauge Tech., Westbury, NY (US)

( * ) Notice: Subject to any disclaimer, the term of this patent is extended or adjusted under 35 U.S.C. 154(b) by 0 days.

(21) Appl. No.: 12/339,825

(22) Filed: Dec. 19, 2008

(65) Prior Publication Data

US 2009/0096654 A1    Apr. 16, 2009

Related U.S. Application Data

(63) Continuation-in-part of application No. 12/075,690, filed on Mar. 13, 2008, which is a continuation-in-part of application No. 12/036,356, filed on Feb. 25, 2008, which is a continuation of application No. 11/341,802, filed on Jan. 27, 2006, now Pat. No. 7,337,081.

(60) Provisional application No. 60/647,669, filed on Jan. 27, 2005.

(51) Int. Cl.
*H03M 1/12*    (2006.01)

(52) U.S. Cl. .......................................... 341/155; 341/156
(58) Field of Classification Search .................. 341/123, 341/156, 155, 117–120
See application file for complete search history.

(56) References Cited

U.S. PATENT DOCUMENTS

| | | | |
|---|---|---|---|
| 6,423,960 B1 * | 7/2002 | Engelhardt et al. | 250/214 R |
| 6,444,971 B1 * | 9/2002 | Engelhardt et al. | 250/214 DC |
| 6,674,379 B1 * | 1/2004 | Li et al. | 341/123 |
| 7,372,574 B2 * | 5/2008 | Sanders et al. | 356/461 |

* cited by examiner

*Primary Examiner* — Jean B Jeanglaude
(74) *Attorney, Agent, or Firm* — Gerald E. Hespos; Michael J. Porco

(57) ABSTRACT

An intelligent electronic device (IED), e.g., an electrical power meter, having circuitry for an input structure of an analog-to-digital converter (ADC) that reduces noise of a signal from a sensor in the device, resulting in a highly accurate power measurement, is provided. The circuitry includes a first single-ended analog-to-digital converter with an input from a voltage signal and a second single-ended analog-to-digital converter with an input that is the reference voltage used by the voltage signal. A programmable device subtracts the digital output of the second single-ended analog-to-digital converter from the digital output of the first single-ended analog-to-digital converter to produce a digital result of the voltage signal that is free from common-mode noise.

24 Claims, 4 Drawing Sheets

INTELLIGENT ELECTRONIC DEVICE HAVING CIRCUITRY FOR NOISE REDUCTION FOR ANALOG-TO-DIGITAL CONVERTERS

PRIORITY

This application is a continuation-in-part application of U.S. patent application Ser. No. 12/075,690 filed on Mar. 13, 2008, which is a continuation-in-part application of U.S. patent application Ser. No. 12/036,356 filed on Feb. 25, 2008, which is a continuation application of U.S. patent application Ser. No. 11/341,802 filed on Jan. 27, 2006, now U.S. Pat. No. 7,337,081, which claims priority to U.S. Provisional Patent Application Ser. No. 60/647,669 filed on Jan. 27, 2005, the contents of all of which are hereby incorporated by reference in their entireties.

BACKGROUND

1. Field

The present disclosure relates generally to intelligent electronic devices (IEDs) for electrical power systems, and more particularly, to an intelligent electronic device having circuitry for an input structure of an analog-to-digital converter (ADC) that reduces noise of a signal from a sensor in the device, resulting in a highly accurate power measurement.

2. Description of the Related Art

Electric utility companies ("utilities") track electric usage by customers by using power meters, also known as intelligent electronic device (IEDs). These meters track the amount of power consumed at a particular location. These locations range from power substations, to commercial businesses, to residential homes. The electric utility companies use information obtained from the power meter to charge its customers for their power consumption, i.e., revenue metering.

A popular type of power meter is the socket-type power meter, i.e., S-base or Type S meter. As its name implies, the meter itself plugs into a socket for easy installation, removal and replacement. Other meter installations include panel mounted, switchboard mounted, and circuit breaker mounted. Additional meter forms include switchboard drawout forms, substation panel metering forms, and A-base front wired forms. Typically, the power meter connects between utility power lines supplying electricity and a usage point, namely, a residence or commercial place of business.

A power meter may also be placed at a point within the utility's power grid to monitor power flowing through that point for distribution, power loss, or capacity monitoring, e.g., a substation. These power and energy meters are installed in substations to provide a visual display of real-time data and to alarm when problems occur. These problems include limit alarms, breaker control, outages and many other types of events. Conventionally, the visual display includes numerical information and/or an alarm indication, e.g., a LED, on the face of the meter.

To determine power consumed in a system, a power meter measures or senses current and voltage of at least one phase of the power distribution system. Voltage transformers, or potential transformers, in the power meter are used to sense or measure the voltage. The sensed voltage signal is transmitted to an analog-to-digital converter (ADC) in the power meter for conversion from analog to digital data, which is stored or processed by the power meter.

Common-mode noise, which can be caused by noise from power lines, power supply ripple, electromagnetic fields, radio frequencies, or high-frequency switching noise, for example, may be present in the voltage transmitted to the voltage input ADC. This noise causes loss of accuracy in meter readings, which can negatively impact the meter's ability to be used for revenue and billing purposes. Various ways of reducing this noise, thereby improving meter accuracy, have been implemented in the art. These solutions have involved changes to the voltage input ADC in the attempt to improve accuracy by reducing common-mode noise.

The structure of the voltage input ADC can be one of three types: single-ended, pseudo-differential, and fully-differential. Additionally, some ADCs known in the art can be configured as either single-ended or pseudo-differential voltage inputs (such as model MAX186 and MAX147 from Maxim Integrated Products, Inc. of Sunnyvale, Calif.); or single-ended or fully-differential voltage inputs (such as model MAX1298 and MAX1286 from Maxim Integrated Products, Inc. of Sunnyvale, Calif.).

Each of these types of voltage input ADCs has benefits as well as drawbacks. With the single-ended voltage input ADC, all voltage signals are referenced to a common ground at the ADC, with each voltage channel using a single input pin. An example of a single-ended voltage input ADC is depicted in FIG. 1A. If the signal source and the ADC are in close proximity, this structure works well. However, DC offset and noise in the signal path decrease the dynamic range of the voltage input signal. The single-ended voltage input ADC has the advantage of being the most inexpensive of the ADC types, but it may not yield accurate enough results for the billing or revenue functions of a power meter.

The pseudo-differential voltage input ADC separates signal ground from the ADC ground, allowing DC common-mode voltages to be cancelled, but this structure does not compensate for AC dynamic common-mode noise. An example of a pseudo-differential voltage input ADC is depicted in FIG. 1B. Even though the pseudo-differential voltage input ADC produces data with greater accuracy than the single-ended structure, it does not filter out all common-mode noise.

The fully-differential voltage input ADC offers maximum noise rejection of the three ADC structures mentioned. An example of a fully-differential voltage input ADC is depicted in FIG. 1C. Like the pseudo-differential ADC, the fully-differential ADC separates signal ground from the ADC ground, rejecting DC common-mode voltages. This structure ADC also offers dynamic common-mode noise rejection, by measuring the difference in voltage between the positive and negative terminals of the voltage sensor. However, the fully-differential input voltage ADC is both more complex and more expensive than the other two structures.

Therefore, there is an increasing demand in the electrical metering industry for devices, such as electrical power meters, analyzers, etc., to be able to accurately measure AC current and its related parameters, e.g., power, energy, power factor, etc., with higher dynamic range and higher precision without incurring significant additional complexity and cost of a implementing fully differential input voltage paths to the ADC.

SUMMARY

An intelligent electronic device (IED), e.g., an electrical power meter, having circuitry for an input structure of an analog-to-digital converter (ADC) that reduces noise of a signal from a sensor in the device, resulting in a highly accurate power measurement, is provided. The circuitry includes a first single-ended analog-to-digital converter with an input from a voltage signal and a second single-ended analog-todigital converter with an input that is the reference voltage used by the voltage signal. A programmable device subtracts the digital output of the second single-ended analog-to-digital converter from the digital output of the first single-ended analog-to-digital converter to produce a digital result of the voltage signal that is free from common-mode noise.

According to one aspect of the present disclosure, a hybrid-differential analog-to-digital converter is provided. The hybrid-differential analog-to-digital converter includes a first single-ended analog-to-digital converter with a first input from a voltage signal, a second single-ended analog-to-digital converter with a second input from a signal ground wherein the signal ground is reference voltage for the voltage signal, and a programmable device in communication with the first output of the first single-ended analog-to-digital converter and the second output of the second single-ended analog-to-digital converter. The programmable device provides a digital result that is the second output subtracted from the first output. The voltage signal can correspond to an output from a sensor that is in communication with the hybrid-differential analog-to-digital converter and the reference voltage for the voltage signal can be a ground for the sensor. Additionally, the first and second single-ended analog-to-digital converters can have a common ground and a common reference voltage, can also be configured to sample the voltage signal and the signal ground simultaneously, and can have similar direct current and alternating current performance. The programmable device can be any programmable device such as a Field Programmable Gate Array, a Complex Programmable Logic Device, or a microcontroller. Additionally, the programmable device can compensate for discrepancies between the first single-ended analog-to-digital converter and the second single-ended analog-to-digital converter by adding gain compensation units to the outputs of the first single-ended analog-to-digital converter and the second single-ended analog-to-digital converter before the subtraction is performed.

In another aspect of the present disclosure, a method for reducing noise in an intelligent electronic device is provided. The method includes inputting a voltage signal into a first single-ended analog-to-digital converter and inputting a signal ground into a second single-ended analog-to-digital converter, wherein the signal ground is a reference voltage for the voltage signal. The method also includes subtracting a second digital output of the second single-ended analog-to-digital converter from a first digital output of the first single-ended analog-to-digital converter. The second digital output corresponds to the signal ground and the first digital output corresponds to the voltage signal.

In yet another aspect of the present disclosure, an intelligent electronic device is provided. The device includes a sensor with a sensor output. The sensor senses a voltage across a load coupled to an electrical distribution system. The device also includes a first single-ended analog-to-digital converter with a first input from a voltage signal. The voltage signal corresponds to the sensor output. The device also includes a second single-ended analog-to-digital converter with a second input from a signal ground. The signal ground is the reference voltage for the sensor. The device further includes a programmable device in communication with the output of the first single-ended analog-to-digital converter and the output of the second single-ended analog-to-digital converter. The programmable device subtracts the output of the second single-ended analog-to-digital converter from the output of the first single-ended analog-to-digital converter to provide a digital result. The device further includes a processor that receives the digital result from the programmable device and determines a value for the voltage across the load.

The above and other aspects, features, and advantages of the present disclosure will become more apparent in light of the following detailed description when taken in conjunction with the accompanying drawings.

Figure 1A:
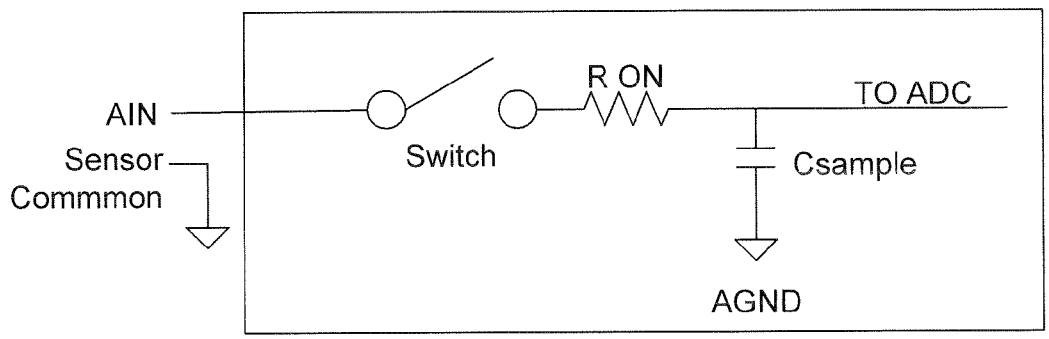
FIG. 1A is a diagram of a prior art single-ended voltage input for an analog-to-digital converter.
Figure 1B:
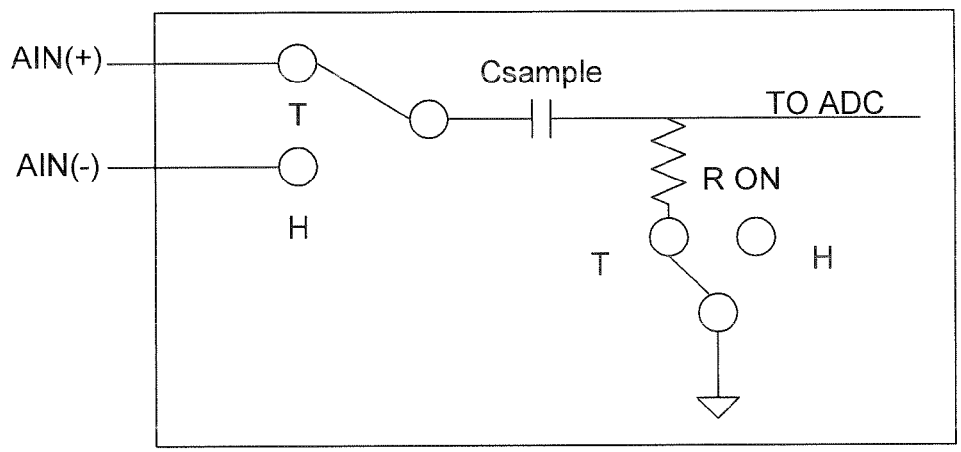
FIG. 1B is a diagram of a prior art pseudo-differential voltage input for an analog-to-digital converter.

To facilitate understanding, identical reference numerals have been used, where possible, to designate identical elements that are common to the figures, except that alphanumerical suffixes may be added, when appropriate, to differentiate such elements. The images in the drawings are simplified for illustrative purposes and are not depicted to scale.

The appended drawings illustrate exemplary embodiments of the present disclosure and, as such, should not be considered as limiting the scope of the disclosure that may admit to other equally effective embodiments. Correspondingly, it has been contemplated that features or steps of one embodiment may beneficially be incorporated in other embodiments without further recitation.

In some embodiments, particular method steps of the discussed methods are performed in the depicted order. In alternate embodiments, in the respective methods, at least two method steps or portions thereof may be performed contemporaneously, in parallel, or in a different order.

DETAILED DESCRIPTION

It should be understood that the elements shown in the figures may be implemented in various forms of hardware, software or combinations thereof. Preferably, these elements are implemented in a combination of hardware and software on one or more appropriately programmed general-purpose devices, which may include a processor, memory and input/output interfaces, programmable logic or other device or devices.

The present description illustrates the principles of the present disclosure. It will thus be appreciated that those skilled in the art will be able to devise various arrangements that, although not explicitly described or shown herein, embody the principles of the disclosure and are included within its spirit and scope.

All examples and conditional language recited herein are intended for pedagogical purposes to aid the reader in understanding the principles of the disclosure and the concepts contributed by the inventor to furthering the art, and are to be construed as being without limitation to such specifically recited examples and conditions.

Moreover, all statements herein reciting principles, aspects, and embodiments of the disclosure, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure.

Thus, for example, it will be appreciated by those skilled in the art that the block diagrams presented herein represent conceptual views of illustrative circuitry embodying the principles of the disclosure. Similarly, it will be appreciated that any flow charts, flow diagrams, state transition diagrams, pseudo-code, and the like represent various processes which may be substantially represented in computer readable media and so executed by a computer or processor, whether or not such computer or processor is explicitly shown.

The functions of the various elements shown in the figures may be provided through the use of dedicated hardware as well as hardware capable of executing software in association with appropriate software. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor ("DSP") hardware, read only memory ("ROM") for storing software, random access memory ("RAM"), and nonvolatile storage, programmable logic or other device or devices.

Other hardware, conventional and/or custom, may also be included. Similarly, any switches shown in the figures are conceptual only. Their function may be carried out through the operation of program logic, through dedicated logic, through the interaction of program control and dedicated logic, or even manually, the particular technique being selectable by the implementer as more specifically understood from the context.

Aspects of the present disclosure are illustratively described herein within the context of intelligent electronic devices ("IEDs") such as electric power meters and power quality analyzers, including portable and accuracy certifiable power quality analyzers. The term "power quality analyzers" is broadly used herein in reference to IEDs adapted to record, measure, and communicate at least some of parameters of waveforms of voltages and currents of a respective electrical service, including their harmonics, transients, ripples, and other disturbances.

It will be appreciated by those skilled in the art that the disclosure may also be utilized within the context of other IEDs, including Programmable Logic Controllers (PLC's), Remote Terminal Units (RTUs), protective relays, fault recorders, and meters, among other devices or systems used to manage and control quality, distribution, and consumption of electrical power.

The word "exemplary" is used herein to mean "serving as an example, instance, or illustration." Any configuration or design described herein as "exemplary" is not necessarily to be construed as preferred or advantageous over other configurations or designs. Herein, the phrase "coupled with" is defined to mean directly connected to or indirectly connected with through one or more intermediate components. Such intermediate components may include both hardware and software based components.

Figure 2:
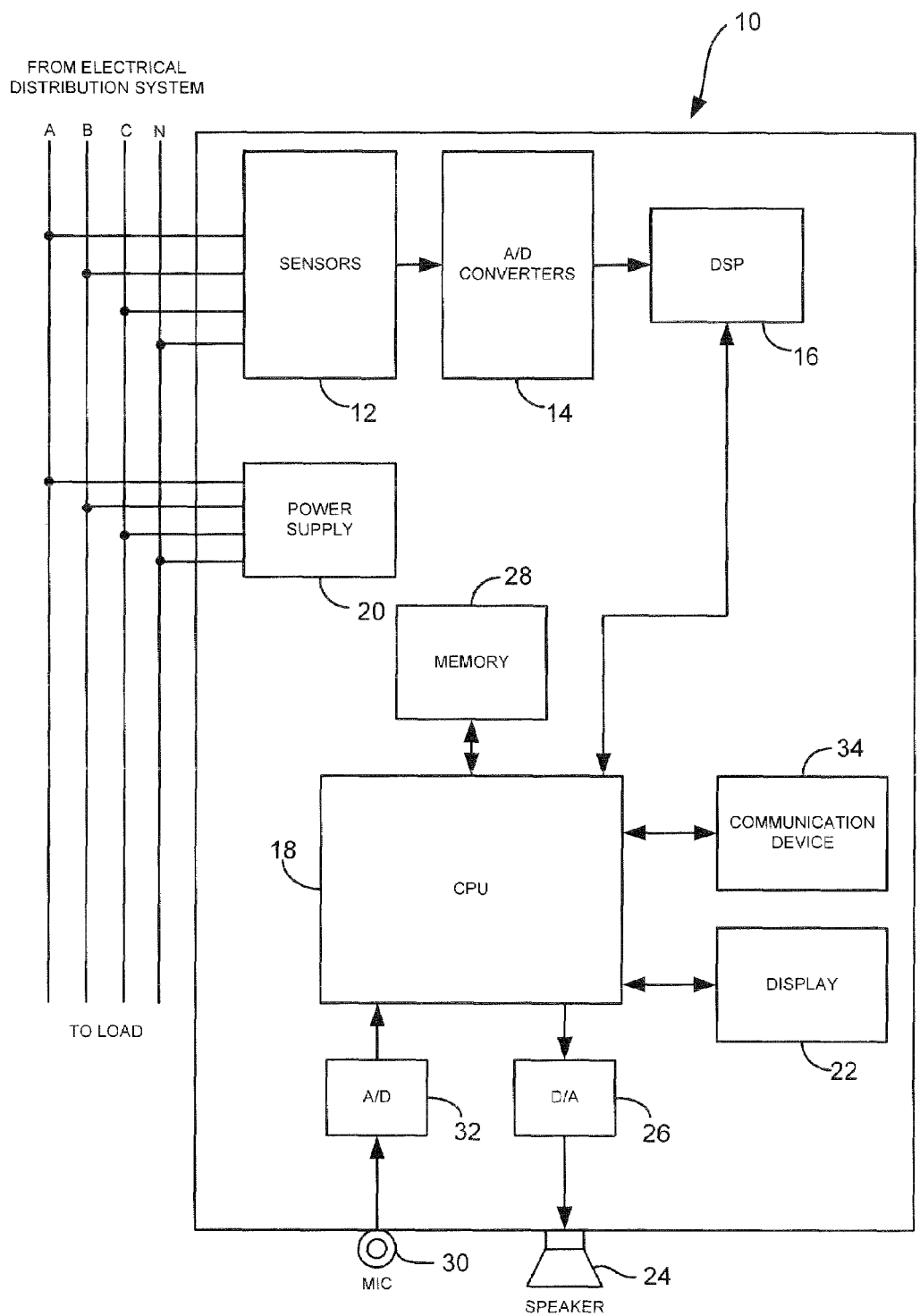
FIG. 2 is a diagram of an intelligent electronic device in accordance with one embodiment of the present disclosure.

An intelligent electronic device (IED) 10 for monitoring and determining an amount of electrical power usage by a consumer and for providing audible and visual indications to a user is illustrated in FIG. 2. Generally, the IED 10 includes sensors 12, a plurality of analog-to-digital converters (ADCs) 14 and a processing system including a central processing unit (CPU) 18 and/or a digital signal processor (DSP) 16. The sensors 12 will sense electrical parameters, e.g., voltage and current, of the incoming lines from an electrical power distribution system, e.g., an electrical circuit. Preferably, the sensors 12 will include current transformers and potential transformers, wherein one current transformer and one voltage transformer will be coupled to each phase of the incoming power lines. A primary winding of each transformer will be coupled to the incoming power lines and a secondary winding of each transformer will output a voltage representative of the sensed voltage and current.

Figure 1C:
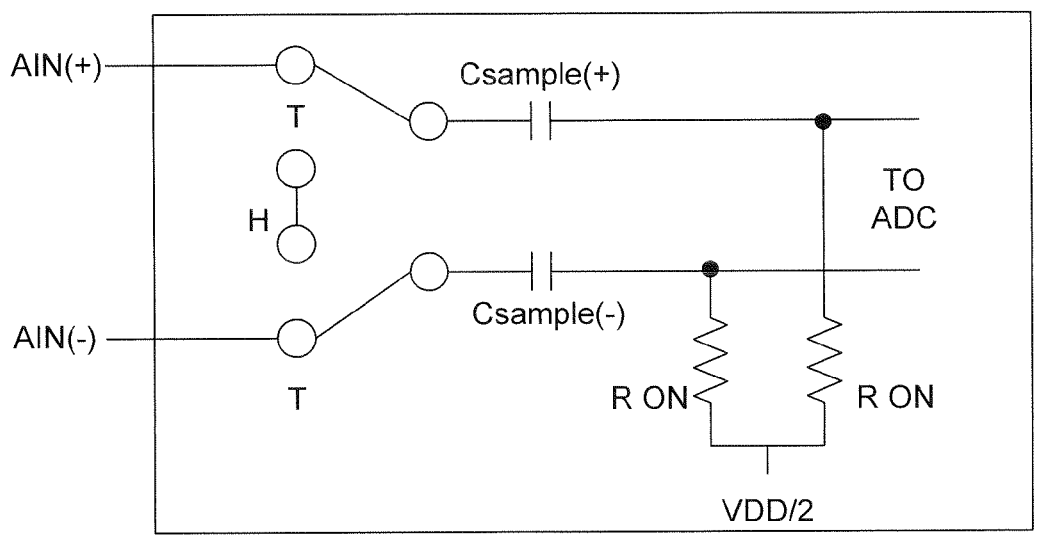
FIG. 1C is a diagram of a prior art fully-differential voltage input for an analog-to-digital converter.
Figure 3A:
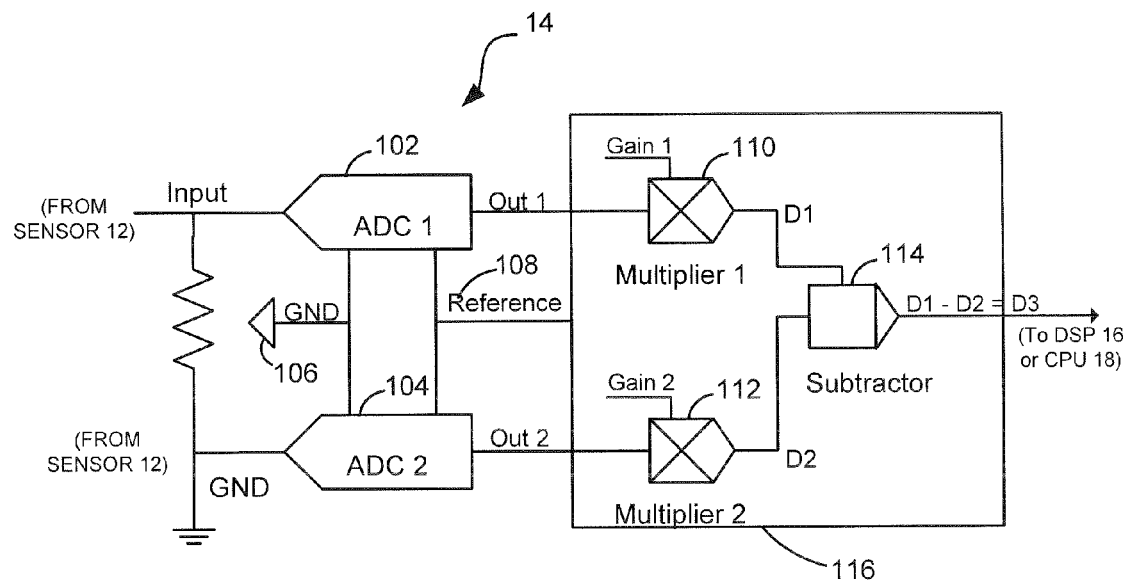
FIG. 3A is a diagram of one embodiment of a hybrid-differential structure for a voltage input analog-to-digital converter in accordance with the present disclosure.

The voltage output of the sensors 12 will be converted to a digital signal by the ADCs 14. FIG. 3A depicts one example of an embodiment of a hybrid-differential voltage input ADC that can be used as one of the ADCs 14 depicted in FIG. 2. This structure allows for double sampling, as with the fully-differential voltage input ADC depicted in FIG. 1C, but instead the subtraction is performed under the control of software or a programmable device 116, such as a Field Programmable Gate Array (FPGA), a Complex Programmable Logic Device (CPLD), or a microcontroller, for example, resulting in an output free of dynamic common-mode noise.

In FIG. 3A, ADC 1 102 and ADC 2 104 are each single-ended voltage input ADCs. The single-ended voltage input ADC used for ADC 1 102 should have the same parameters, such as direct current (DC) and alternating current (AC) performance for example, as the single-ended voltage input ADC used for ADC 2 104. An example of a commercially available single-ended voltage input ADC that can be used for ADC 1 102 and ADC 2 104 is model AD7656 from Analog Devices, Inc. of Norwood, Mass. ADC 1 102 connects to the signal input, which, in the example depicted in FIG. 2, would be the voltage signal output from sensor 12. However, if the sensor 12 outputs a current signal, the output from the current sensor can be converted to a voltage before being inputted into ADC 1 102. ADC 2 104 connects to the ground which the signal is referenced to (i.e. the ground used for sensor 12). Additionally, ADC 1 102 and ADC 2 104 must each be connected to a common ground 106 and a common voltage reference 108. ADC 1 102 and ADC 2 104 must also perform simultaneous sampling of the signal input and the signal ground.

When ADC 1 102 and ADC 2 104 each sample the analog input signal, ADC 1 102 and ADC 2 104 each output a corresponding digital signal. The difference between the output from ADC 1 102 (i.e. Out 1) and the output from ADC 2 104 (i.e. Out 2) is the common-mode noise present at the output of sensor 12. Subtracting Out 2 from Out 1 subtracts out this noise, resulting in a digital signal of the sensor 12 reading without the common-mode noise. It should be noted that the effectiveness of this implementation is by using two channels within the same physical device which has multiple ADC's. This provides matched delays for the signal paths for both signals so that the subtraction is very accurate in time. This subtraction is performed by the programmable device 116 described above. The programmable device 116 can also multiply each of the outputs by a predetermined gain compensation to correct any discrepancies between ADC 1 102 and ADC 2 104. After the discrepancies are compensated for by adding gain, the programmable device 116 subtracts the two results from each other to obtain the digital signal free of noise. In FIG. 3A, Multiplier 1 110 multiplies Out 1 by Gain 1 to obtain the result D1. Multiplier 2 112 multiplies Out 2 by Gain 2 to obtain the result D2. Subtractor 114 subtracts D2 from D1 to obtain the noise-free digital signal D3. The output from the hybrid-differential voltage input ADC 14 is sent to either the DSP 16 or the CPU 18. Operating in the digital domain to make the corrections supports very accurate adjustment capability and repeatable results and with either no calibration of the circuitry or greatly simplified calibration procedures to make the correction.

It is to be appreciated that the functionality of programmable device 116 could be implemented in DSP 16 and/or CPU 18, where the programmable device 116 would not be a hardware component but a software component.

Figure 3B:
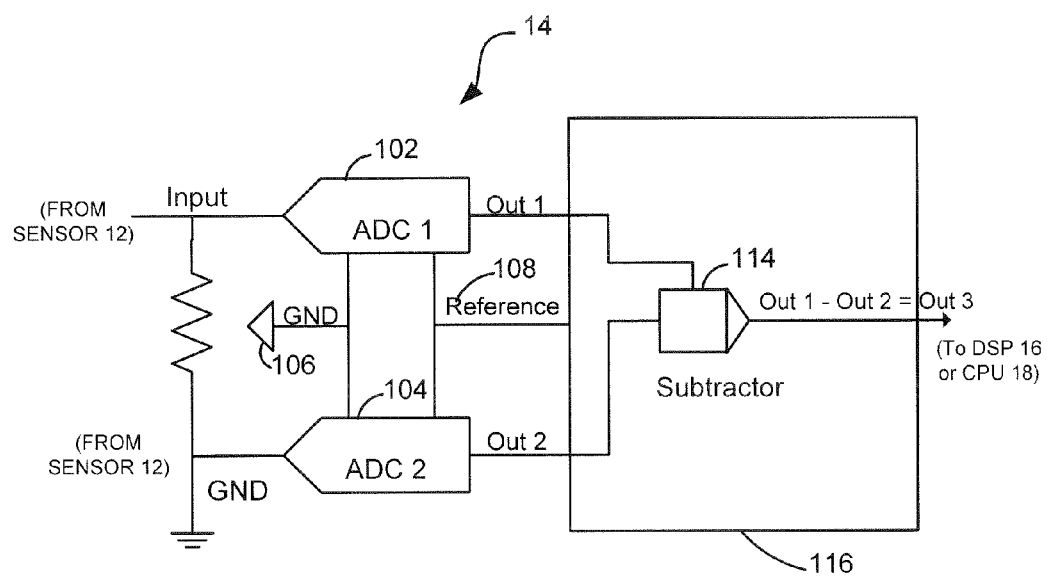
FIG. 3B is a diagram of one embodiment of a hybrid-differential structure for a voltage input analog-to-digital converter in accordance with the present disclosure.

FIG. 3B depicts an alternate embodiment for a hybrid-differential voltage input ADC 14. In FIG. 3B, there is no gain compensation required because ADC 1 102 and ADC 2 104 have no or minimal discrepancies. ADC 1 102 has an input that is the signal output from sensor 12. ADC 2 104 has an input that is the signal ground from sensor 12. ADC 1 102 and ADC 2 104 are connected to a common ground 106 and a common voltage reference 108. The output of ADC 1 102 is Out 1, which is a digital signal that was converted from the analog input signal from sensor 12. The output of ADC 2 104 is Out 2, which is the digital signal that was converted from the analog input ground signal from sensor 12. Subtractor 114 subtracts Out 2 from Out 1 to obtain a digital signal Out 3 corresponding to the sensor 12 analog output free from common-mode noise. Operating in the digital domain to make the corrections supports very accurate adjustment capability and repeatable results with either no calibration or greatly simplified calibration procedures to make the correction. The digital signal is sent to DSP 16 or CPU 18.

In one implementation of the present disclosure, two Analog Device AD7656 ADCs are used. Each AD7656 has 6 voltage input channels in 3 pairs. For this implementation, the voltage sampling signals are synchronized, and the on-chip reference source is utilized. There are 12 channel ADC available but only 8 signals need to be measured: Vae, Vbe, Vce, Vne, Via, Vib, Vic, and Vin; here, the current has been converted into voltage to measure. Vae, Vbe, Vce, and Vne are connected to one chip; Via, Vib, Vic, and Vin are connected to a second chip. The other four channels of the 12-channel ADC are connected to ground. The programmable device, e.g., FPGA, performs the subtraction on the signals, as seen in the following equations.

$$Vae-Vne=Van$$

$$Vbe-Vne=Vbn$$

$$Vce-Vne=Vcn.$$

After the subtraction, the resulting output is free of dynamic common-mode noise.

Referring back to FIG. 2, the CPU 18 is configured for receiving the digital signals from the ADCs 14 to perform the necessary calculations to determine the power usage and controlling the overall operations of the IED 10. In another embodiment, the DSP 16 will receive the digital signals from the ADCs 14 and perform the necessary calculations to determine the power usage to free the resources of the CPU 18. It is to be appreciated that in certain embodiments the CPU 18 may perform all the functions performed by the CPU 18 and DSP 16, and therefore, in these embodiments the DSP 16 will not be utilized.

A power supply 20 is also provided for providing power to each component of the IED 10. In one embodiment, the power supply 20 is a transformer with its primary windings coupled to the incoming power distribution lines and having an appropriate number of windings to provide a nominal voltage, e.g., 5 VDC, at its secondary windings. In other embodiments, power is supplied from an independent source to the power supply 20, e.g., from a different electrical circuit, a uninterruptible power supply (UPS), etc.

The IED 10 of the present disclosure will have user interface for interacting with a user and for communicating events, alarms and instructions to the user. The user interface will include a display 22 for providing visual indications to the user. The display 22 may include a touch screen, a liquid crystal display (LCD), a plurality of LED number segments, individual light bulbs or any combination of these. The display 22 may provide the information to the user in the form of alpha-numeric lines, computer-generated graphics, videos, etc. Visual information provided on the display 22 may include but is not limited to instructional videos, operating manuals associated with an IED, a flowchart for troubleshooting, a checklist for troubleshooting, etc. Digital files including the various visual instructions are stored in either memory 28 or retrieved from a remote event server.

The user interface will also include an audible output device 24, e.g., a speaker. The speaker 24 will be coupled to the CPU 18 via a digital-to-analog converter (D/A) 26 for converting digital audio files stored in memory 28 to analog signals playable by the speaker 22. The audible output device 24 may simply provide audible instructions to a user when an event is detected or may provided audio with a corresponding video being displayed on the display 22.

The device 100 of the present disclosure will support various file types including but not limited to Microsoft Windows Media Video files (.wmv), Microsoft Photo Story files (.asf), Microsoft Windows Media Audio files (.wma), MP3 audio files (.mp3), JPEG image files (.jpg, .jpeg, .jpe, .jfif), MPEG movie files (.mpeg, .mpg, .mpe, .m1v, .mp2v .mpeg2), Microsoft Recorded TV Show files (.dvr-ms), Microsoft Windows Video files (.avi) and Microsoft Windows Audio files (.wav).

The memory 28 is configured for storing the files including the visual and/or audible instructions. The memory 28 includes internal storage memory, e.g., random access memory (RAM), or removable memory such as magnetic storage memory; optical storage memory, e.g., the various known types of CD and DVD media; solid-state storage memory, e.g., a CompactFlash card, a Memory Stick, Smart-Media card, MultiMediaCard (MMC), SD (Secure Digital) memory; or any other memory storage that exists currently or will exist in the future. By utilizing removable memory, an IED can be easily upgraded with new instruction files as needed.

In one embodiment, the digital audio files may be programmed directly through the IED 10. In this embodiment, the IED 10 will include an audio input device 30, e.g., a microphone, for receiving spoken words in the form of analog signals. The analog signals will then be sent to an analog-to-digital converter (A/D) 32 to convert the analog signals into digital signals understandable by the CPU 18. The CPU 18 will then store the recorded digital audio file in the memory 28. The user may associate the recorded digital file with a particular alarm through the touch screen display 22. Alternatively, the user may associate the recorded digital file with an event code.

In a further embodiment, the IED 10 will include a communication device 34 for enabling communications between the IED 10 and other computing devices, e.g., a desktop computer, laptop computer, other IEDs, etc. The communication device 34 may be a modem, network interface card (NIC), wireless transceiver, etc. The communication device 34 will perform its functionality by hardwired and/or wireless connectivity. The hardwire connection may include but is not limited to hard wire cabling e.g., parallel or serial cables, USB cable, Firewire (1394 connectivity) cables, and the appropriate port. The wireless connection will operate under any of the various known wireless protocols including but not limited to Bluetooth™ interconnectivity, infrared connectivity, radio transmission connectivity including computer digital signal broadcasting and reception commonly referred to as Wi-Fi or 802.11.X (where x denotes the type of transmission), satellite transmission or any other type of communication protocols or systems currently existing or to be developed for wirelessly transmitting data.

Figure 4:
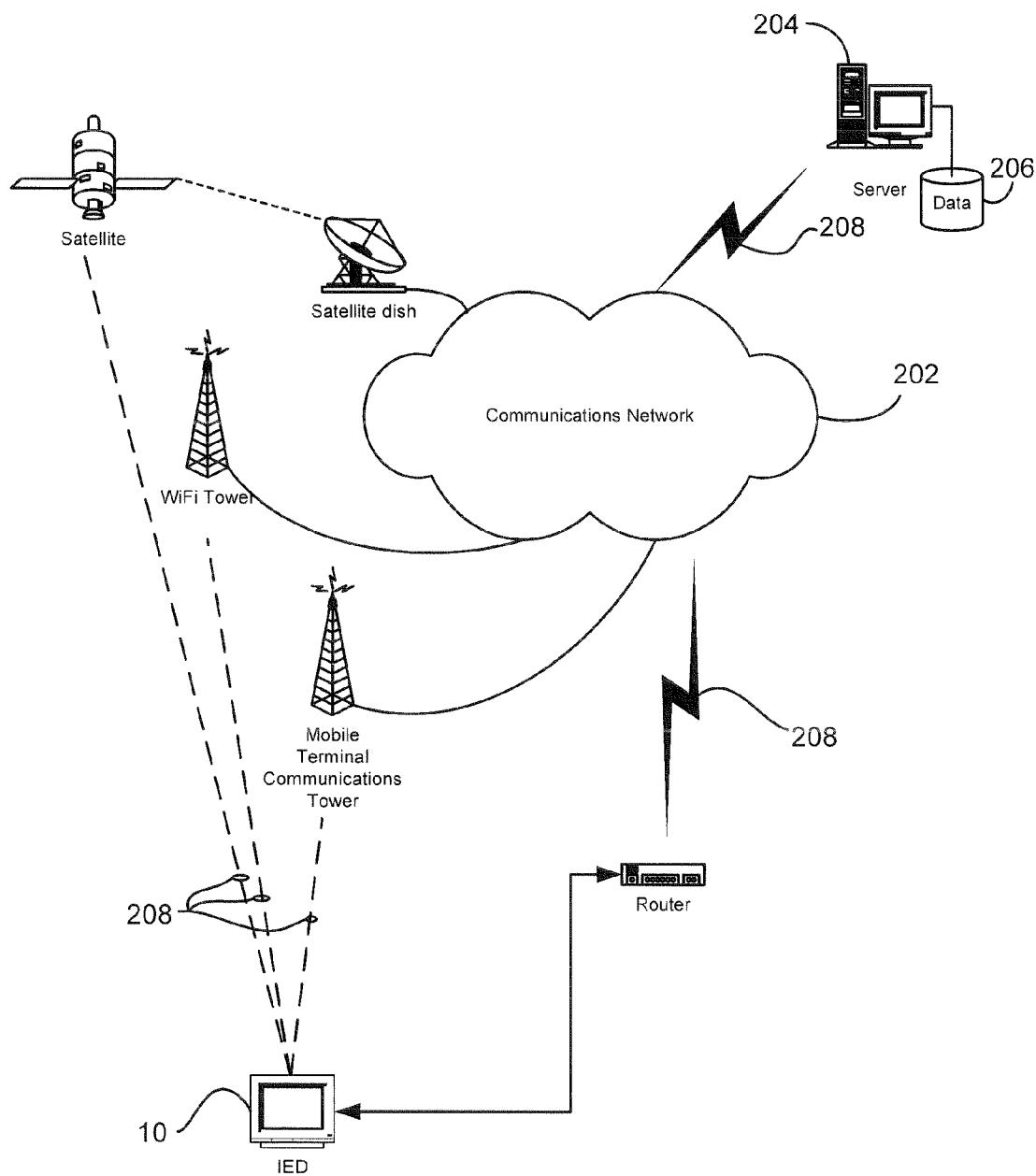
FIG. 4 is a system employing an intelligent electronic device in accordance with one embodiment of the present disclosure.

Referring to FIG. 4, The IED 10 will communicate to a server 204 via a communication network 202. The IED 10 and server 204 may be connected to the communications network 202, e.g., the Internet, by any known means, for example, a hardwired or wireless connection 208, such as dial-up, hardwired, cable, DSL, satellite, cellular, PCS, wireless transmission (e.g., 802.11a/big), etc. It is to be appreciated that the network 202 may be a local area network (LAN), wide area network (WAN), the Internet or any known network that couples a plurality of computers to enable various modes of communication via network messages. Furthermore, the server 204 will communicate using the various protocols such as Transmission Control Protocol/Internet Protocol (TCP/IP), File Transfer Protocol (FTP), Hypertext Transfer Protocol (HTTP), etc. and secure protocols such as Internet Protocol Security Protocol (IPSec), Point-to-Point Tunneling Protocol (PPTP), Secure Sockets Layer (SSL) Protocol, etc. Furthermore, the IED 10 and server 204 will employ various metering protocols including but not limited to Modbus, Modbus/TCP, DNP 3.0, etc. The server 204 will further include a storage medium 206 for storing a database of instructional videos, operating manuals, etc., the details of which will be described in detail below.

In this embodiment, the digital audio and/or video files, e.g., instruction files, may be recorded on a remote server 204 and downloaded to the IED 10 via the communication device 34 over a network, e.g., the Internet. In one embodiment, the server 204 includes a database 206 of predetermined instruction files which may be downloaded to the IED 10 and stored in the memory 28 upon an event command issued by a user, on a schedule or by triggered by the IED 10. In another embodiment, upon each detection of an event, the IED 10 will transmit to the server 204 an event code and the server 204 will return an instruction file associated to the event code. In this embodiment, the instruction files will be maintained in one location ensuring all available IEDs 10 in a network will access the most up-to-date instructions It is to be appreciated that any known or to be developed digital audio and/or visual format may be employed in the IED of the present disclosure, e.g., MP3, WMA (Windows Media Audio), WAV, Real Audio, MIDI, etc. Furthermore, the remote server 204 will include a plurality of digital file converters for converting the digital files in database 206 from any available format to a format compatible with the IED.

In a further embodiment, microphone 106 and speaker 24 are further coupled to the communication device 34 for enabling voice communication from the IED to a remote location. In one embodiment, the communication device 34 will enable voice communications with VoIP (Voice over Internet Protocol) or may include a mobile communications module operating on CDMA, PCS, GSM or any other known wireless communication technology.

It is to be appreciated that the communication device 34 may include a single integrated circuit chip to perform data transfer and voice communications or a single module including a separate data transfer chip, e.g., a WiFi transceiver, and a separate voice communication chip, e.g., a CDMA chip. In one embodiment, the communication device 34 will operate on the wireless GPRS (General Packet Radio Service) data protocol or a 3G protocol such as W-CDMA, CDMA2000 and TD-SCDMA. Both the GPRS and 3G protocols have the ability to carry both voice and data over the same service.

In this embodiment, when an event is detected, an operator at the location of the IED 10 may communicate with a remote operator, e.g., a technical support operator, for facilitating the rectification of the event. The operator at the IED 10 will have a two-way communication with the technical support operator in an attempt to troubleshoot the event.

It is to be understood that the present disclosure may be implemented in various forms of hardware, software, firmware, special purpose processors, or a combination thereof. The IED also includes an operating system and micro instruction code. The various processes and functions described herein may either be part of the micro instruction code or part of an application program (or a combination thereof) which is executed via the operating system.

It is to be further understood that because some of the constituent system components and method steps depicted in the accompanying figures may be implemented in software, the actual connections between the system components (or the process steps) may differ depending upon the manner in which the present disclosure is programmed. Given the teachings of the present disclosure provided herein, one of ordinary skill in the related art will be able to contemplate these and similar implementations or configurations of the present disclosure.

Although the disclosure herein has been described with reference to particular illustrative embodiments, it is to be understood that these embodiments are merely illustrative of the principles and applications of the present disclosure. Therefore numerous modifications may be made to the illustrative embodiments and other arrangements may be devised without departing from the spirit and scope of the present disclosure, which is defined by the appended claims.

Furthermore, although the foregoing text sets forth a detailed description of numerous embodiments, it should be understood that the legal scope of the invention is defined by the words of the claims set forth at the end of this patent. The detailed description is to be construed as exemplary only and does not describe every possible embodiment, as describing every possible embodiment would be impractical, if not impossible. One could implement numerous alternate embodiments, using either current technology or technology developed after the filing date of this patent, which would still fall within the scope of the claims.

It should also be understood that, unless a term is expressly defined in this patent using the sentence "As used herein, the term '_____' is hereby defined to mean . . . " or a similar sentence, there is no intent to limit the meaning of that term, either expressly or by implication, beyond its plain or ordinary meaning, and such term should not be interpreted to be limited in scope based on any statement made in any section of this patent (other than the language of the claims). To the extent that any term recited in the claims at the end of this patent is referred to in this patent in a manner consistent with a single meaning, that is done for sake of clarity only so as to not confuse the reader, and it is not intended that such claim term be limited, by implication or otherwise, to that single meaning. Finally, unless a claim element is defined by reciting the word "means" and a function without the recital of any structure, it is not intended that the scope of any claim element be interpreted based on the application of 35 U.S.C. §112, sixth paragraph.

What is claimed is:

1. A hybrid-differential analog-to-digital converter, comprising:
a first single-ended analog-to-digital converter having a first input from a voltage signal;
a second single-ended analog-to-digital converter having a second input from a signal ground wherein said signal ground is a first reference voltage for said voltage signal; and
a programmable device in communication with a first output of said first single-ended analog-to-digital converter and a second output of said second single-ended analog-to-digital converter, said programmable device provides a digital result that is said second output subtracted from said first output, wherein said digital result is free from common-mode noise, wherein said voltage signal corresponds to an output from a sensor coupled with said hybrid-differential analog-to-digital converter and said first reference voltage is a sensor ground of said sensor.

2. The hybrid-differential analog-to-digital converter of claim 1, wherein said programmable device compensates for discrepancies between said first single-ended analog-to-digital converter and said second single-ended analog-to-digital converter.

3. The hybrid-differential analog-to-digital converter of claim 1, wherein said first single-ended analog-to-digital converter and said second single-ended analog-to-digital converter have a common ground and a common reference voltage.

4. The hybrid-differential analog-to-digital converter of claim 1, wherein said first single-ended analog-to-digital converter and said second single-ended analog-to-digital converter are configured to sample said voltage signal and said signal ground simultaneously.

5. The hybrid-differential analog-to-digital converter of claim 1, wherein said first single-ended analog-to-digital converter and said second single-ended analog-to-digital converter have similar direct current and alternating current performance.

6. The hybrid-differential analog-to-digital converter of claim 1, wherein said programmable device is a Field Programmable Gate Array.

7. The hybrid-differential analog-to-digital converter of claim 1, wherein said programmable device is a Complex Programmable Logic Device.

8. The hybrid-differential analog-to-digital converter of claim 1, wherein said programmable device is a microcontroller.

9. A method for reducing noise in an intelligent electronic device, comprising:
inputting a voltage signal into a first single-ended analog-to-digital converter, the voltage signal being generated by a sensor sensing a voltage across a load;
inputting a signal ground of the sensor into a second single-ended analog-to-digital converter wherein said signal ground is a first reference voltage of said voltage signal; and
subtracting a second digital output of said second single-ended analog-to-digital converter from a first digital output of said first single-ended analog-to-digital converter wherein said second digital output corresponds to said signal ground and said first digital output corresponds to said voltage signal, said subtracted result is free from common-mode noise.

10. The method of claim 9, further comprising:
prior to said step of subtracting, adding first gain compensation to said first digital output and adding second gain compensation to said second digital output wherein said first gain compensation and said second gain compensation compensate for discrepancies between said first single-ended analog-to-digital converter and said second single-ended analog-to-digital converter.

11. The method of claim 9, wherein said first single-ended analog-to-digital converter and said second single-ended analog-to-digital converter have a common ground and a common reference voltage.

12. The method of claim 9, wherein said first single-ended analog-to-digital converter and said second single-ended analog-to-digital converter are configured to sample said voltage signal and said signal ground simultaneously.

13. The method of claim 9, wherein said first single-ended analog-to-digital converter and said second single-ended analog-to-digital converter have similar direct current and alternating current performance.

14. The method of claim 9, wherein said step of subtracting is performed by a programmable device.

15. A revenue meter for determining power consumed in an electrical distribution system, comprising:
a potential transformer coupled to at least one phase of the electrical distribution system;
a first single-ended analog-to-digital converter coupled to the potential transformer for receiving a first signal indicative of a voltage on the at least one phase of the electrical distribution system;
a second single-ended analog-to-digital converter coupled to a signal ground of the potential transformer; and
at least one processing device coupled to the first and second single-ended analog-to-digital converters for receiving the first signal and the ground signal, subtracting the ground signal from the first signal to determine a noise-free voltage signal of the at least one phase of the electrical distribution system,
wherein the at least one processing device determines an amount of power consumed on the at least one phase of the electrical distribution system based on the noise free voltage signal.

16. An intelligent electronic device for determining power consumed in an electrical distribution system, comprising:
a sensor having a sensor output wherein said sensor senses a voltage across a load of at least one phase of the electrical distribution system;
a first single-ended analog-to-digital converter having a first input from a voltage signal wherein said voltage signal corresponds to said sensor output;
a second single-ended analog-to-digital converter having a second input from a signal ground of said sensor wherein said signal ground is a first reference voltage for said sensor;
a programmable device in communication with a first output of said first single-ended analog-to-digital converter and a second output of said second single-ended analog-to-digital converter, said programmable device provides a digital result that is said second output subtracted from said first output, wherein said digital output is free from common-mode noise; and
a processor that receives said digital result, determines a value for said voltage across said load and determines an amount of power consumed across said load.

17. The intelligent electronic device of claim 16, wherein said first single-ended analog-to-digital converter and said second single-ended analog-to-digital converter have a common ground and a common reference voltage.

18. The intelligent electronic device of claim 16, wherein said first single-ended analog-to-digital converter and said second single-ended analog-to-digital converter are configured to sample said voltage signal and said signal ground simultaneously.

19. The intelligent electronic device of claim 16, wherein said first single-ended analog-to-digital converter and said second single-ended analog-to-digital converter have similar direct current and alternating current performance.

20. The intelligent electronic device of claim 16, wherein said programmable device compensates for discrepancies between said first single-ended analog-to-digital converter and said second single-ended analog-to-digital converter.

21. The intelligent electronic device of claim 16, wherein said programmable device is a Field Programmable Gate Array.

22. The intelligent electronic device of claim 16, wherein said programmable device is a Complex Programmable Logic Device.

23. The intelligent electronic device of claim 16, wherein said programmable device is a microcontroller.

24. The intelligent electronic device of claim 16, wherein said first single-ended analog-to-digital converter and said second single-ended analog-to-digital converter are two channels of the same physical device.

* * * * *